(12) United States Patent
Stetson et al.

(10) Patent No.: US 6,590,513 B2
(45) Date of Patent: Jul. 8, 2003

(54) DATA ACQUISITION SYSTEM USING PREDICTIVE CONVERSION

(75) Inventors: Philip S. Stetson, Garland, TX (US); Teddy D. Thomas, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/141,394

(22) Filed: May 8, 2002

(65) Prior Publication Data

US 2003/0006921 A1 Jan. 9, 2003

Related U.S. Application Data

(60) Provisional application No. 60/302,004, filed on Jun. 29, 2001.

(51) Int. Cl.$^7$ ................................................. H03M 3/00
(52) U.S. Cl. ...................................... 341/143; 341/155
(58) Field of Search ................................ 341/120, 118, 341/155, 144, 143, 131

(56) References Cited

U.S. PATENT DOCUMENTS 5,838,272 A * 11/1998 Steiner ........................ 341/143
6,433,723 B1 * 8/2002 Randall ...................... 341/155

* cited by examiner

Primary Examiner—Brian Young
(74) Attorney, Agent, or Firm—Robert D. Marshall, Jr.; W. James Brady, III; Frederick J. Telecky, Jr.

(57) ABSTRACT

A data acquisition system uses an analog-to-digital converter (ADC) that includes a prediction feedback element. Using the computing power of a digital signal processor, the system predicts the next sample of the target signal based on pre-defined rules and previous samples. This digital prediction is converted to an analog signal using a digital-to-analog converter (DAC). An analog error summer compares the predicted signal with the target signal and creates an error signal. The digital signal processor uses the prediction error to more accurately predict the next sample. A negative feedback loop is thus formed by this system to drive the prediction error toward zero. Operating on the relatively small error signal in the forward and feedback paths enhances the conversion performance and data transfer efficiency.

16 Claims, 13 Drawing Sheets

REAL

IMAGINARY

REAL

IMAGINARY

COMPLEX

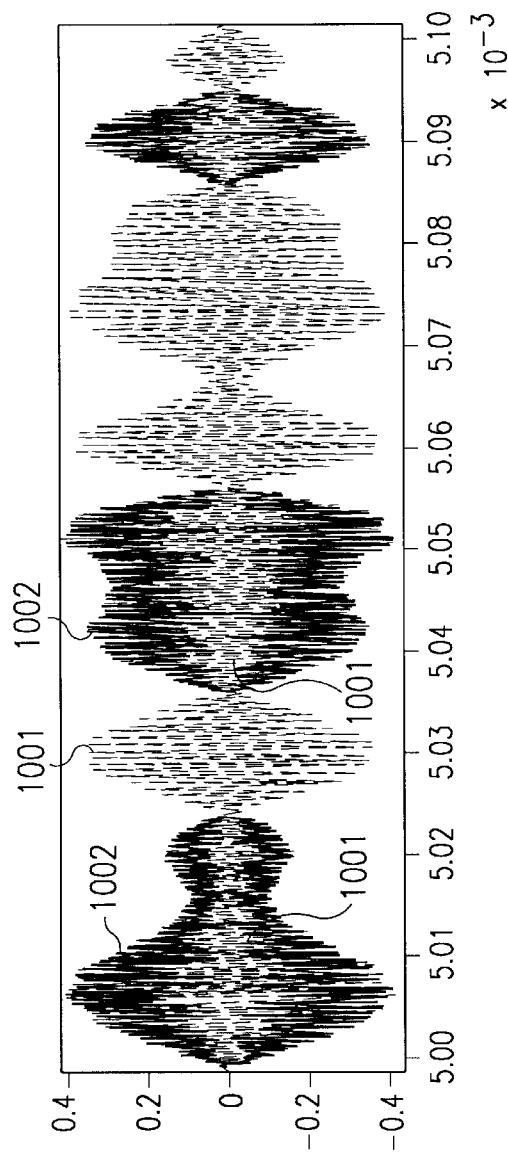
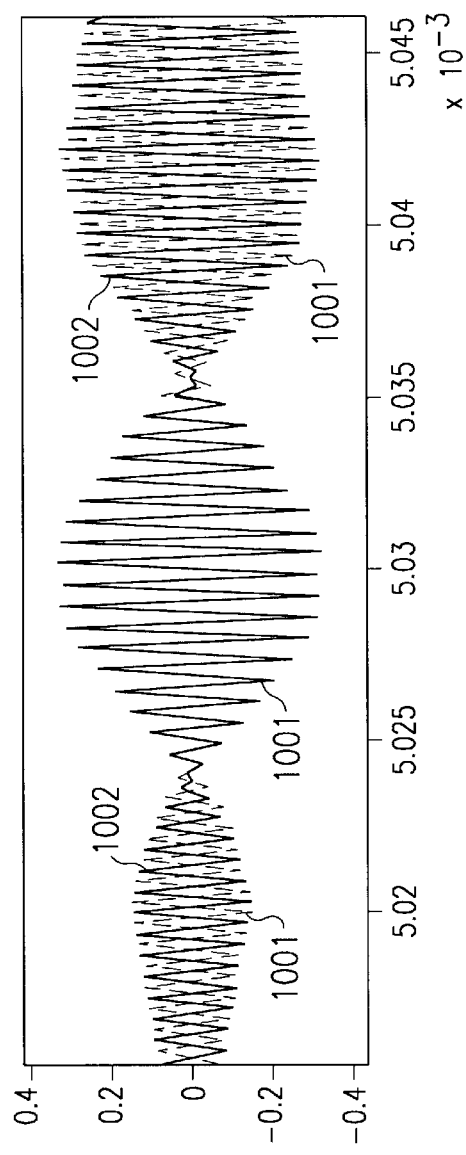
FIG. 10a
FIG. 10b

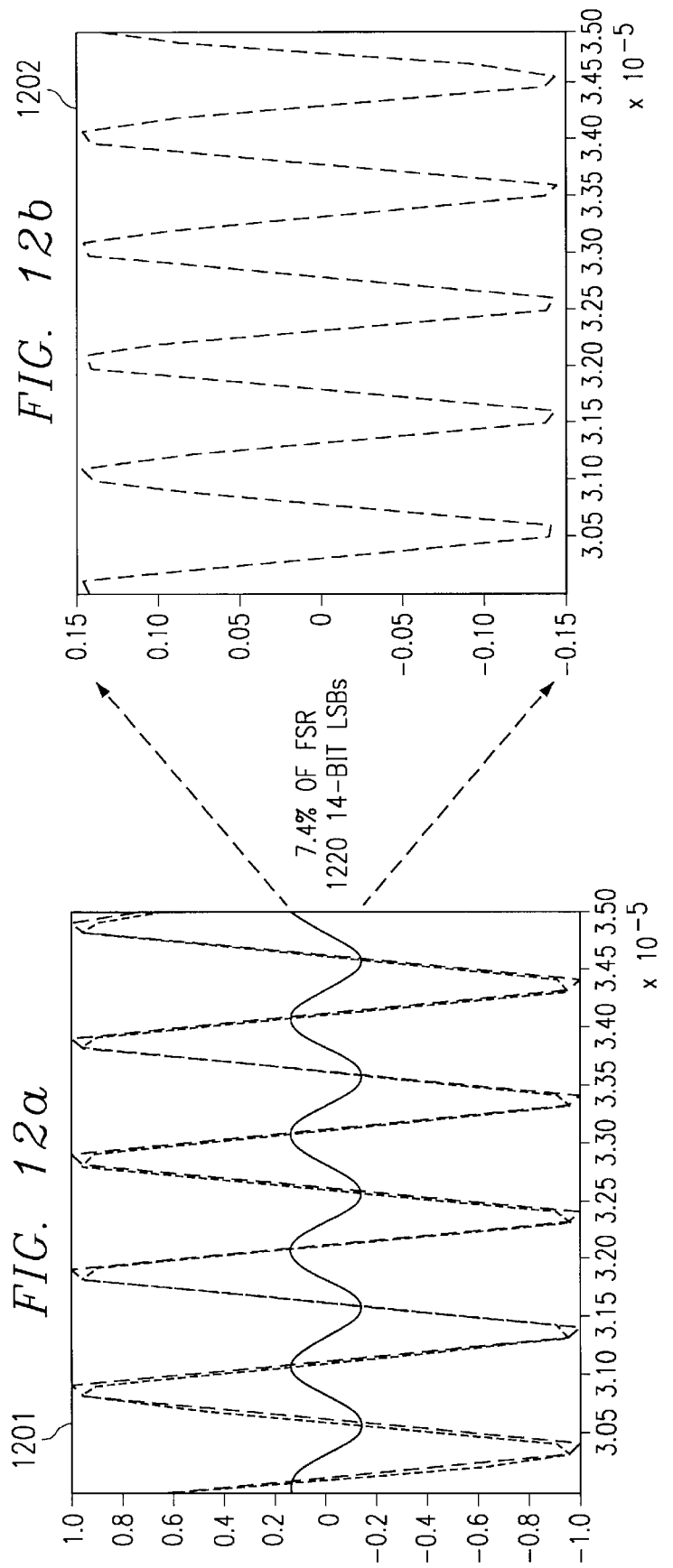

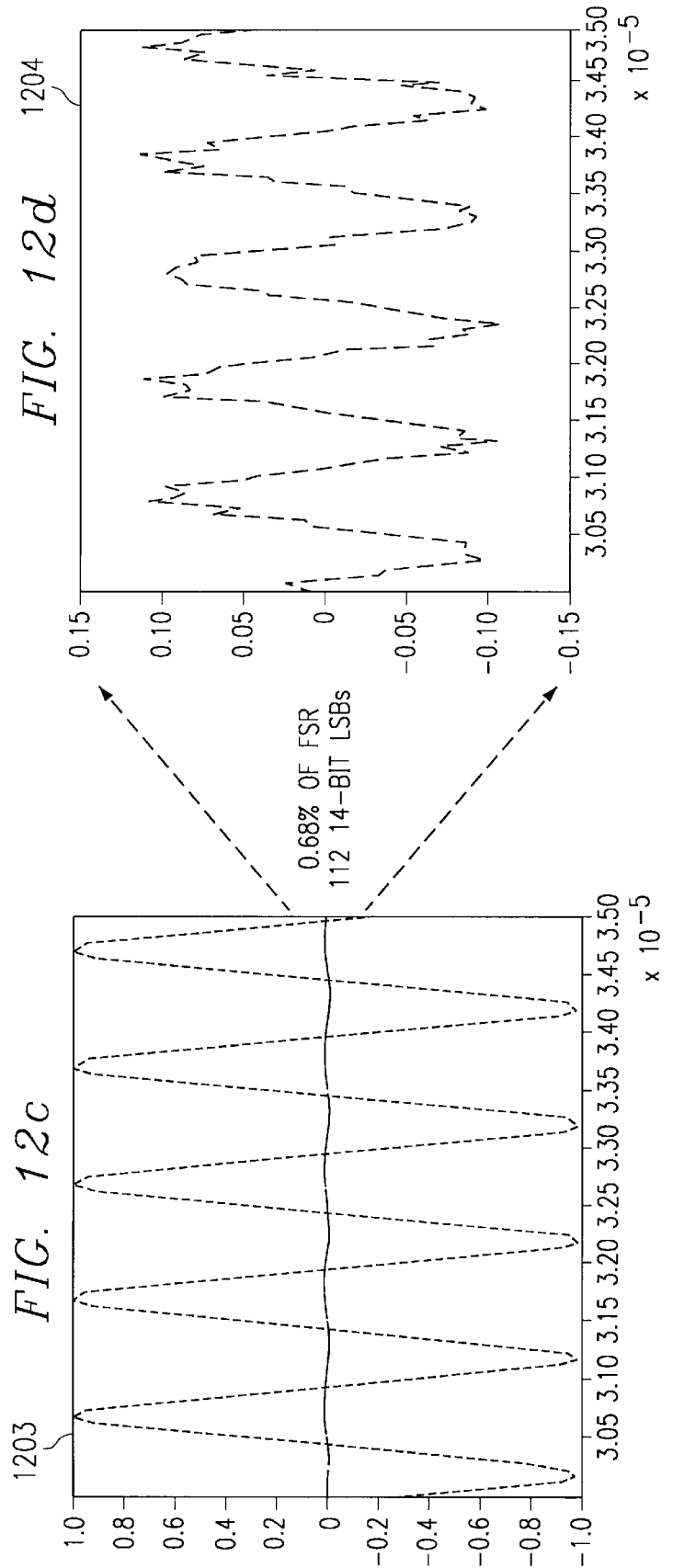

DATA ACQUISITION SYSTEM USING PREDICTIVE CONVERSION

This application claims Priority under 35 USC §119(e)(1) of Provisional Application No. 60/302,004, filed Jun. 29, 2001.

TECHNICAL FIELD OF THE INVENTION

The technical field of this invention is analog to digital conversion.

BACKGROUND OF THE INVENTION

The majority of conventional analog-to-digital converters (ADC) used in communications applications are self-contained devices that do not take advantage of the structured nature of the signals they convert. They operate essentially open loop and then feed each output data sample to a digital signal processor (DSP) as if these samples were uncorrelated to previous or future samples. These analog-to-digital converters do not take advantage of the highly correlated nature of information signals. This mode of operation is therefore highly inefficient for data transfer and leads to extremely complex design specifications for the converter element.

Conventional analog-to-digital converters have the following characteristics. The structure and predictable behavior of target signals are ignored. The system digital signal processors play a passive role in conventional acquisition processes and thus rely on the open loop performance of the conversion system. The differing silicon fabrication requirements of high performance analog and digital functions are not properly addressed.

FIG. 1 illustrates a fundamental conventional analog-to-digital converter system driving a digital signal processor. An input analog signal 100 is converted to an N-bit binary-weighted digital signal 104 in the analog-to-digital converter 102. The output stage of the analog-to-digital converter typically contains a first-in-first-out (FIFO) memory 103 that allows for pipelining flexibility. The digital signal processor 105 performs a potentially wide range of processing steps to improve the quality and usefulness of the signal. The N-bit binary interface was developed for a random signal. Typically, the signal to be converted is not at all random, but has a highly predictable behavior.

Feedback has been applied to analog-to-digital converters in some conventional designs. This has been largely in the form of the 'sigma-delta' modulator analog-to-digital converter. In this approach, the conversion process focus is on changes in the signal to be converted. A Nyquist sampler is so named because it samples at the Nyquist rate, which is twice the highest frequency component of the input signal. Sigma-delta modulators are over-sampled converters in that they require sampling rates significantly higher than the Nyquist rate.

FIG. 2 illustrates this approach in a basic 1-bit sigma-delta modulator. Analog data input samples X(nT) 200 are processed through an input summing function 202 whose output is integrated by the integrator block 203. The integrated output is fed to a 1-Bit analog-to-digital converter 204. The output from 204 forms a digital output signal Y(z) 206 that may be further processed to improve its quality and usefulness. Output 206 is also converted to analog by digital-to-analog converter (DAC) 208 with output 209 forming the subtraction input to summing junction 202.

The sigma-delta modulator performs the following useful operations. These modulators utilize over-sampling to spread the quantization noise over an increased frequency range. These modulators move and shape quantization noise resulting in an increased portion of in-band noise being moved out-of-band. These modulators use digital decimation filters to remove out-of-band noise and reduce the effective sampling rate at the sigma-delta modulator output.

Sigma-delta modulators have disadvantages that limit their usefulness. When converting signals that change rapidly thus containing high frequency components, sigma-delta modulators must use a high sampling rate to maintain the required level of oversampling. This becomes prohibitive for many applications.

Sigma-delta modulators have been extended in a limited fashion to utilize an N-Bit analog-to-digital converter and digital-to-analog converter, but these are limited to low bit-sizes due to the complexity of implementing multi-bit converters at the required over-sampling ratio. The signal-to-noise ratio of a sigma-delta modulator is a complex function of the over-sampling ratio, the order of the integrator, higher order integrators can push more of the in-band noise out-of-band, and the number of bits in the quantizer and digital-to-analog converter. Sigma-delta modulators must either maintain a given over-sampling ratio which requires very high sampling rates for high-frequency input signals, or increase the order of the integrator which can cause stability problems, or increase the number of bits in the quantizer and digital-to-analog converter which adds complexity (and significant cost) to the design.

SUMMARY OF THE INVENTION

The predictive data acquisition system of this invention comprises an analog-to-digital converter that includes a prediction feedback element in an architecture that is significantly different from conventional analog-to-digital converter systems. The converter uses the computing power of a digital signal processor to exploit the inherent structure of the target signal by predicting the next sample based on pre-defined rules and previous samples.

This digital prediction is converted to an analog signal using a digital-to-analog converter. An analog input summing network and error amplifier compares the predicted signal with the target input signal and creates an error signal. An error encoder translates the error signal into a form that the digital signal processor can understand.

The prediction feedback element contains a prediction core processor and a parameter estimator each having model parameter inputs from a digital signal processor which controls the processing according to the prediction algorithm. The prediction core processor uses the prediction error and output from its parameter estimator to more accurately predict the next sample. A negative feedback loop is thus formed by this system. Careful design of the prediction algorithm can be made to drive the prediction error toward zero. Operating on the relatively small error signal in the forward and feedback paths enhances the conversion performance and data transfer efficiency.

BRIEF DESCRIPTION OF THE DRAWINGS

These and other aspects of this invention are illustrated in the drawings, in which:

FIGS. 10a–10b illustrates the results of a QAM prediction scheme with no phase tracking, with FIG. 10(a) illustrating the prediction of a 16 QAM signal with no phase tracking and FIG. 10(b) illustrating an expanded view of the phase mismatch for various symbols;

FIGS. 12a–12d illustrates prediction output, actual output and prediction error at two over-sampling ratios demonstrating that incremental improvement in prediction accuracy reduces the signal-to-noise ratio of the prediction error (signal component decreases);

DETAILED DESCRIPTION OF PREFERRED EMBODIMENTS

This invention is a predictive data acquisition system. The predictive data acquisition employs the following techniques:

1. Placing the conversion task in the digital signal processor programmable software specialized core processor;
2. Transferring only the unanticipated information from the analog to the digital domain;
3. Using signal structure to predict the next sample; and
4. Exploiting the foreknowledge of signal characteristics to anticipate the behavior of the input analog signal.

The predictive data acquisition system essentially partitions the analog-to-digital conversion process into wholly analog and wholly digital operations. The system takes advantage of the structure inherent to modulator-demodulator (modem) communications to reduce the work required of analog portion of the conversion system. The solution involves prediction of the future behavior of a signal based on past samples and foreknowledge of the signal characteristics, rather than ignoring such foreknowledge and converting the absolute signal level at each and every sampling instant.

There are numerous advantages in the system described here. Among the most important are that the system:

1. Allows separate functional blocks of an analog-to-digital converter to be fabricated in separate customized process technologies;
2. Allows performance of the conversion hardware to be determined primarily by digital signal processor and software performance;
3. Allows a significant portion of the converter functionality and performance to be determined by software; and
4. Creates an analog-to-digital converter that is a closed-loop system, with the feedback increasing performance and decreasing cost by easing manufacturing and test requirements.

Figure 3:
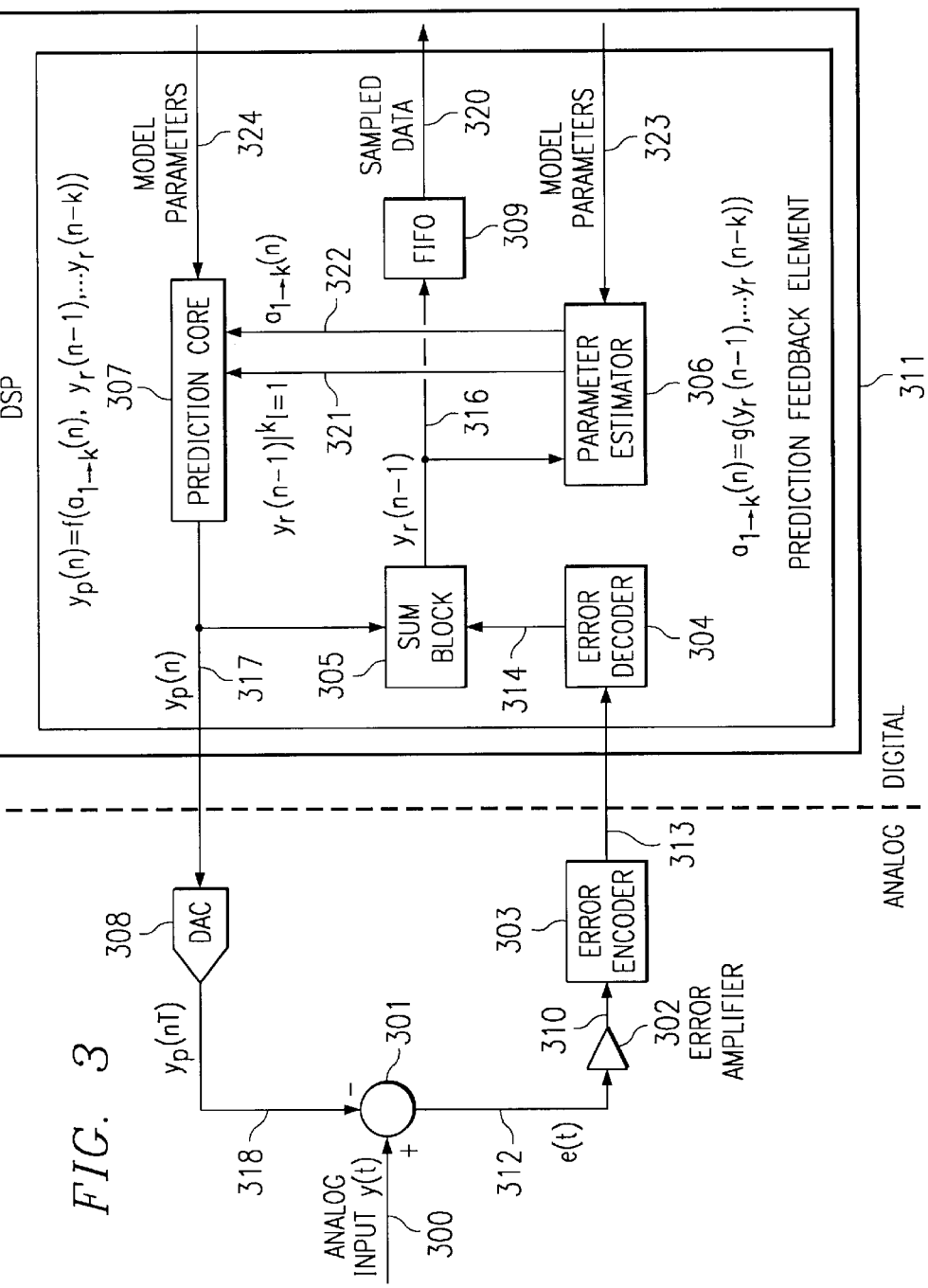
FIG. 3 illustrates the data acquisition system of this invention using predictive conversion.

FIG. 3 illustrates in block diagram form the basic predictive data acquisition system. This predictive data acquisition system included an analog portion and a digital portion. Analog input data 300 is applied to one input of summing network 301. Summing network 301 generates the difference between input data 300 and predicted signal 318. The resultant sum 312 is the error signal e(t). This error signal is amplified in analog form in amplifier 302 and encoded into digital form in error encoder 303.

The digital portion of the predictive converter is concentrated in two main blocks: the parameter estimator 306; and the prediction core 307. Digital signal processor 311 supplies model parameters 323 to the parameter estimator 306 and model parameters 324 to prediction core 307. These model parameters are used for initialization of the prediction process. Sum block 305 forms the difference between predicted signal 317 and the error signal 314. The output signal $y_r(n-1)$ 316 passes to the parameter estimator 306. Parameter estimator 306 observes the incoming recovered signal $y_r(n-1)$ and calculates new coefficients to improve the prediction accuracy. This function is represented mathematically by the equation referencing the parameter estimator block:

$$a_{1 \to k} = g(y_r(n-1), \ldots, y_r(n-k)) \qquad [1]$$

Equation [1] shows a series of coefficients $a_1$ through $a_k$ as a function of previous data samples. The function $g(y_r)$ is set by the digital signal processor specifically to track the target signal. Prediction core 307 generates the next predicted signal 317 based on the current coefficients, past samples, and a mathematical model provided by the digital signal processor. This prediction core function is also represented by the equation shown in FIG. 3:

$$y_p(n) = f(a_{1 \to k}, y_r(n-1), \ldots, y_r(n-k)) \qquad [2]$$

Parameter estimator 306 supplies all necessary inputs to prediction core 307 through signals 321 and 322. Performing a set of operations dictated by the prediction algorithm, prediction core 307 supplies the predicted signal 317. The reconstructed data output $y_r(n-1)$ from the sum block 305 is stored in first-in-first-out (FIFO) memory 309 for interface with the digital signal processor 311 as sampled data 320. The predicted signal 371 output from prediction core 307 is also passed to the digital-to-analog converter 308 on the analog side of the system. Digital-to-analog converter 308 conversion yields the analog feedback signal $y_p(nT)$ 318 to the input summing network 301.

Since digital-to-analog converter 308 generates analog predicted signal 318, least significant bit of digital-to-analog converter 308 represents the smallest voltage difference detectable between input signal 300 and predicted signal 318. This minimum detectable difference is the predictive converter least significant bit and sets the maximum signal-to-noise ratio of the predictive converter not including digital post-processing of the digitized signal. Furthermore the output range of digital-to-analog converter 308 sets the maximum range over which input signal 300 can be tracked. These two characteristics dictate the predictive converter's maximum dynamic range. There is a trade-off between the complexity of the error encoder and the required prediction quality, given the target resolution as set by digital-to-analog converter 308. Error encoder 303 translates the error voltage into a number of digital-to-analog converter least significant bits representing the error digitally. Since error encoder 303 is limited in its range (M-bits can encode up to $2^M$ digital-to-analog converter least significant bits of error), a simple error encoder implementation implies the need for high prediction accuracy. Conversely, a complex error encoder 303 with a wide dynamic range can translate a comparatively large error, requiring less accuracy in the original prediction. The respective resolutions of digital-to-analog converter 308 and error encoder 303 directly affect the overall signal-to-noise ratio of the predictive converter. This happens because the quantization noise of each play a significant role in dictating the converter's signal-to-noise ratio.

In summary, the predictive data acquisition system uses a prediction algorithm to calculate the expected next sample from: previous signal samples; prediction error associated with these samples; and pre-defined knowledge of the signal characteristics.

Each data sample is divided into two portions: the expected; and the unexpected. The original predicted signal 318 represents the expected portion of the data sample. In turn, prediction error 312, being the difference between input signal 300 at the sampling instant and predicted signal 318, represents the unexpected portion of the data sample. As the prediction core iterates according to its algorithm through the conversion process, the unexpected portion of the data sample contains incrementally less signal contribution signifying that acquisition is occurring.

The effectiveness of the prediction algorithm reflects how close to the actual signal the prediction lies. This implies that as the prediction iterations acquire the signal, error signal output 310 of error amplifier 302, input to the error analyzer becomes smaller. This reduced error signal dynamic range simplifies the error encoder design. The resolution of digital-to-analog converter 308 sets the overall resolution of the system. The least significant bit of digital-to-analog converter 308 is the smallest detectable voltage difference between prediction signal 317 and input signal 300.

In a sampled data system, the quantization noise, stemming from the discrete voltage steps, is spread over a frequency range or band from zero frequency up to one-half the sampling rate. The Nyquist rate, or minimum sampling rate is defined as twice the upper frequency limit of the signal bandwidth. Sampling rates above twice the upper limit frequency band of the signal are described by the ratio by which they exceed this Nyquist rate frequency. As this over-sampling ratio (OSR) increases, this frequency band widens. However the amount of quantization noise remains constant so this noise is spread over a wider range of frequencies, thus reducing the quantization noise level. Process gain is a measure of the signal-to-noise ratio improvement as a result of over-sampling. In the predictive converter, increased over-sampling also simplifies the prediction by decreasing the change (delta) in the input signal from one sample to the next.

Error encoder 303 translates analog error signal 310 from error amplifier 302 into a form the digital signal processor can understand. In the simplest form, error encoder 310 is an analog-to-digital converter. While the resolution of this analog-to-digital converter must be the same as digital-to-analog converter 308 to maintain the overall converter resolution, the full scale range is significantly reduced. For example, a predictive converter of 14-bit accuracy needs a true 14-bit digital-to-analog converter, but error encoder 303 implemented as an analog-to-digital converter may only need a 4-bit analog-to-digital converter with a 14-bit least significant bit size. The requirements placed on error encoder 303 depend on the quality of the prediction algorithm.

Error encoder 303 could be used to encode other digital formats. One such format would use pulse-width modulation (PWM). Another format might entail the use of frequency shift keying (FSK), or generation of custom codes, known as symbols, of many possible special types.

Error decoder 304 serves to decode coded error signal 313 as translated by error encoder 303. In the case where error encoder 303 is a simple analog-to-digital converter, error decoder 304 performs no real processing. However, should a different coding scheme be employed, error decoder 304 must translate the input it receives from error encoder 303 into form useable by the digital signal processor.

The digital-to-analog converter 308 converts the digital predicted signal 317 into an analog representation for comparison with the actual input signal 300. The prediction algorithm performs the task of predicting future samples based on past samples and programmed rules.

To understand the role of the prediction algorithm it is helpful to start with a basic example. Consider the case of a signal describing the motion of an object. The location of the object can be predicted by judging its current position, velocity and acceleration, and applying foreknowledge of preferred routes. This model has a familiar natural analog described by the difference function which approximates a derivative.

$$\partial^i y(n) \approx \Delta^i y(n) = y^{i-1}(n) - y^{i-1}(n-1) \qquad [3]$$

The next sample of position may be expressed in terms of past samples as:

$$y_p(n+1) = y(n) + \Delta y(n) + \Delta^2 y(n) + \Delta^3 y(n) + \Delta^4 y(n) \qquad [4]$$

where: $y(n)$ corresponds to the current position; $\Delta y(n)$ corresponds to the current velocity; $\Delta^2 y(n)$ corresponds to the current acceleration; and $+\Delta^3 y(n)$ and $\Delta^4 y(n)$ are additional higher order terms. Additionally:

$$\Delta y(n) = y(n) - y(n-1) \qquad [5]$$

$$\Delta^2 y(n) = \Delta y(n) - \Delta y(n-1) = y(n) - 2y(n-1) + y(n-2) \qquad [6]$$

$$\Delta^3 y(n) = \Delta^2 y(n) - \Delta^2 y(n-1) = y(n) - 3y(n-1) + 3y(n-2) - y(n-3) \qquad [7]$$

$$\Delta^4 y(n) = \Delta^3 y(n) - \Delta^3 y(n-1) = y(n) - 4y(n-1) + 6y(n-2) - 4y(n-3) + y(n-4) \qquad [8]$$

Figure 1:
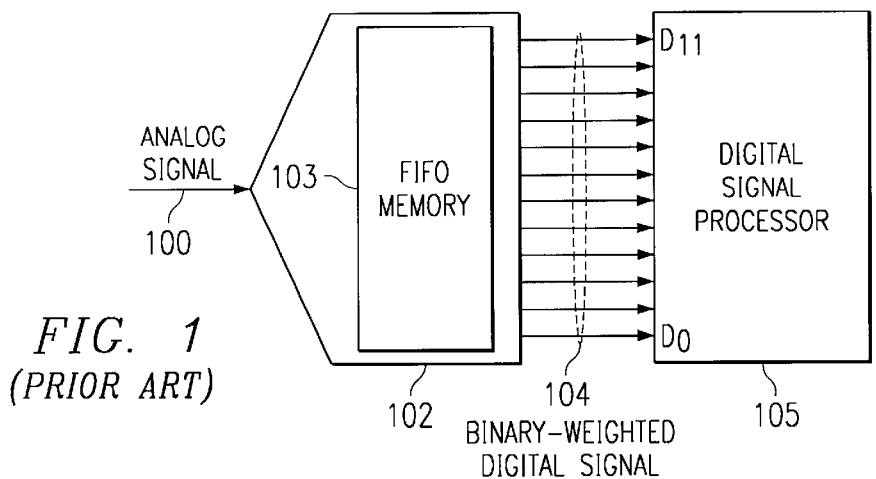
FIG. 1 illustrates the open loop analog-to-digital converter to digital signal processor interface according to the prior art.
Figure 2:
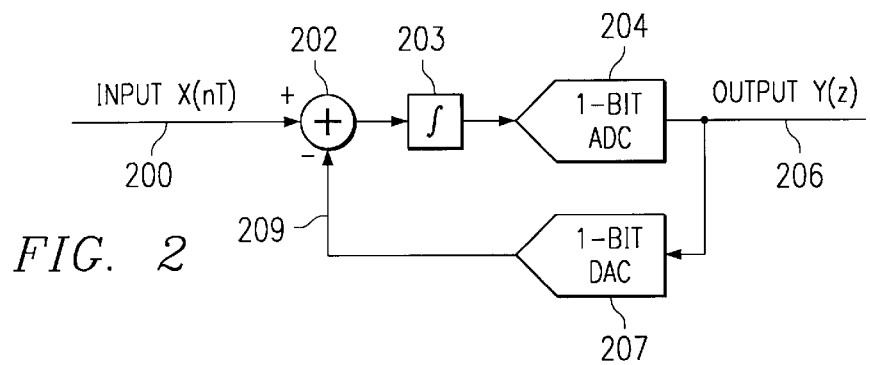
FIG. 2 illustrates the sigma-delta modulator analog-to-digital converter according to the prior art.
Figure 4:
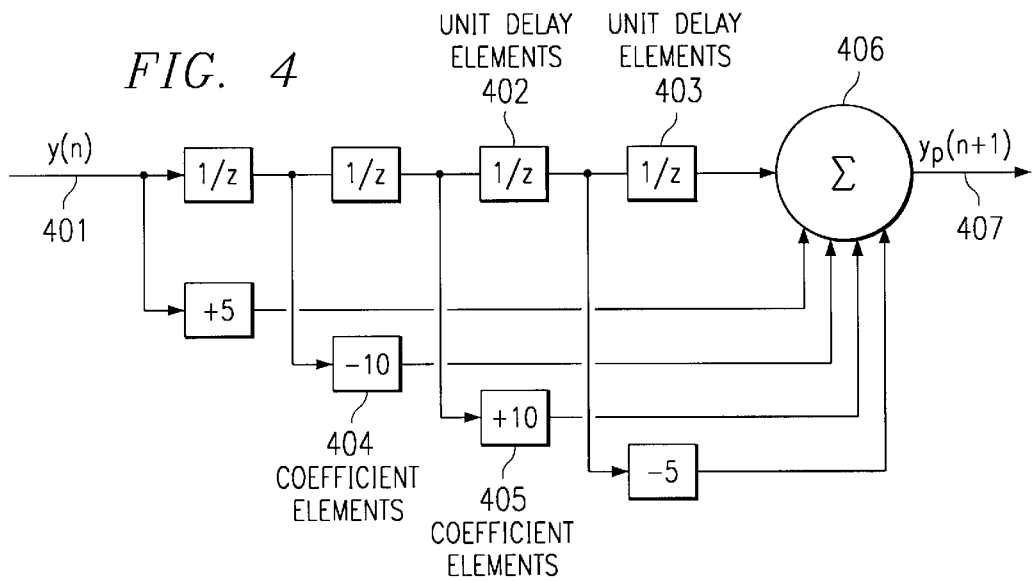
FIG. 4 illustrates the block diagram representation of a simple 3rd-order difference predictor implemented as an finite-impulse-response filter.

FIG. 4 illustrates a filter function realized by these equations through a series of substitutions. This form of filter is a finite-impulse-response (FIR) filter. Input signal y(n) 401 is passed through a series of unit delay elements such as 402 and 403. The output signal of each delay element is applied as inputs to the coefficient elements illustrated such as 404 and 405. The summation is formed at summing junction 406 resulting in the output $y_p(n+1)$ 407.

Figure 5:
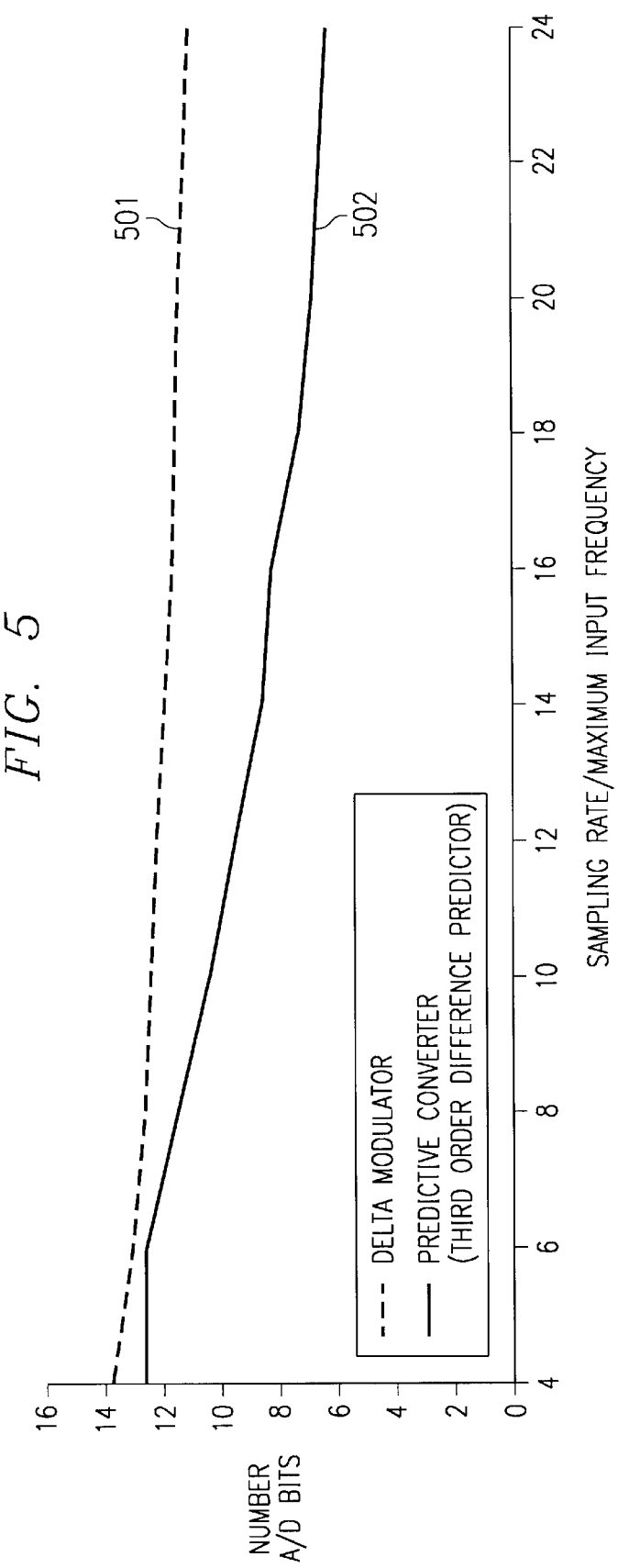
FIG. 5 illustrates the number of analog-to-digital converter bits required versus over-sampling ratio for a predictive converter (3rd order difference predictor) versus a delta modulator for a one megahertz sinusoid.

FIG. 5 illustrates the comparison of results obtained using a delta modulator and a simple predictive filter derived from a third order difference equation predictor on a one megahertz sinusoid. Curves 501 and 502 demonstrate a decrease in the number of analog-to-digital converter bits required as the over-sampling rate increases. Curve 501 illustrates the number of required analog-to-digital converter bits relative to the oversampling ratio in a delta modulator converter. As the over-sampling increases from 4 to 24, the number of analog-to-digital converter bits required drops approximately from 14 to 12. Curve 502 similarly illustrates the number of required analog-to-digital converter bits relative to the oversampling ratio in a predictive converter. As the over-sampling ratio increases from 4 to 24, the number of analog-to-digital converter bits required in the simple predictive converter drops approximately from 14 to 6.

Some examples of algorithms which could be appropriate in data acquisition applications are: auto-regressive moving average (ARMA) model; Kalman filters; and system-specific predictors.

The auto-regressive moving average model is a general form of linear predictive coding the predicted value of the signal. This is a linear combination of past values and past inputs according to the formula:

$$s(n) = \sum_{k=1}^{p} a_k s(n-k) + G \sum_{l=0}^{q} b_l U(n-l) \qquad [9]$$

where: s(n) is the predicted value; s(n−k) are the past samples; u(n−1) are past inputs; $a_k$ are coefficients of past samples; $b_1$ are coefficients of past inputs; and G is gain of the past input signal path and the summations determine the range of past samples and past inputs used in the linear combination. If we take for the error signal only the most recent past input rather than the sum of q+1 of such inputs by setting q=0, the auto-regressive moving average general equation reduces to the auto-regressive (AR) model which is more commonly used.

$$s(n) = \sum_{k=1}^{p} a_k s(n-k) + e(n) \qquad [10]$$

or $$e(n) = s(n) - \sum_{k=1}^{p} a_k s(n-k) \qquad [11]$$

The Kalman Filter is an auto-regressive model well suited for extracting a signal from added noise. The following illustrative example of signal enhancement uses the Kalman filter approach. In this model:

$$y_p(n) = a(n) \times (n) + k(n)[y(n) - a(n) \times (n)] \qquad [12]$$

where: y(n) is $x_s(n)+v(n)$; e(n) is $y(n)-y_p(n)$, the error signal; $x_s(n)$ is the target signal which is unobservable; $y_p(n)$ is the Predicted signal; y(n) is the observed signal; v(n) is the process/measurement noise; and k(n) is a Kalman gain term.

The goal of this approach is to calculate a(n) such that e(n) has minimal energy in the least square sense. The Kalman filter weighs the predicted value against the measured value depending on the confidence of the algorithm in the measurement. The Kalman gain term k(n) represents this confidence. If the prediction error has been small then the k(n) will tend to weigh the prediction more heavily, while large prediction errors tend to make the algorithm lean towards the measured value. The final product of this process is to make $y_p(n)$ approach $x_s(n)$. The Kalman Filter serves to eliminate v(n) from the estimation.

One of the primary advantages of the predictive converter architecture is its ability to exploit the foreknowledge of a system's architecture in the conversion process. This foreknowledge can be as simple as the target signal(s) bandwidth or as complex as a complete model of the modulation methods and construction of the target signal(s). Detailed understanding of the system architecture and the target signal(s) provides a direct means of improving the analog-to-digital conversion performance using a predictive converter. This ability breaks the dependence of traditional analog-to-digital converter performance on incremental design and process improvements and enables performance enhancements via software. A simple example of such a system-specific predictor is that of a quadrature-amplitude modulation (QAM) predictor.

Figure 6:
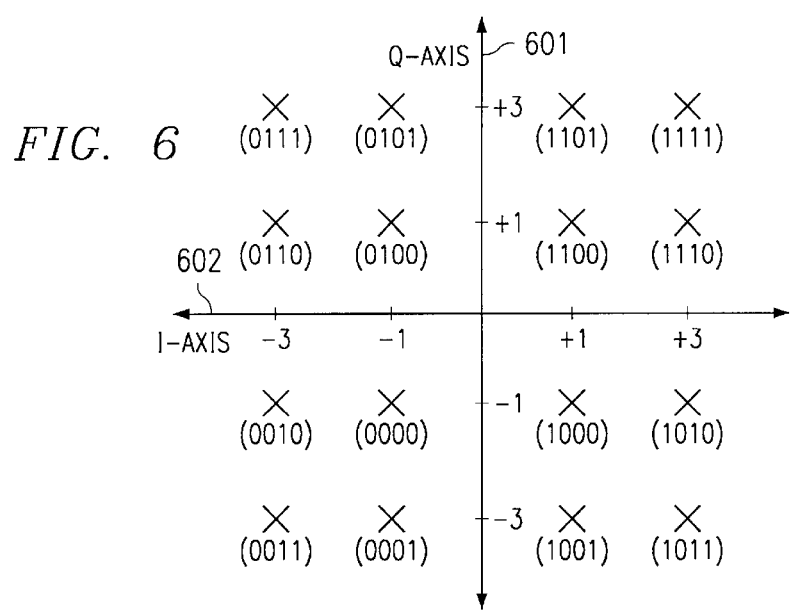
FIG. 6 illustrates the constellation diagram for grey-coded 16-quadrature amplitude modulation.
Figure 7A:
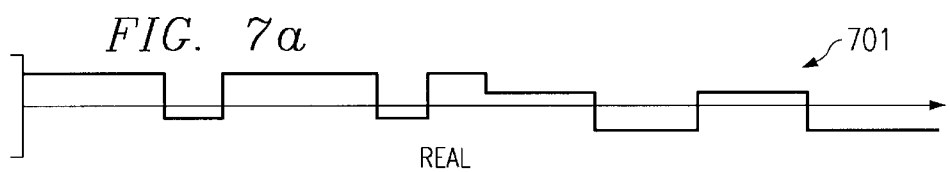
FIGS. 7a–7e illustrates the building of the QAM waveform from its components.
Figure 7B:
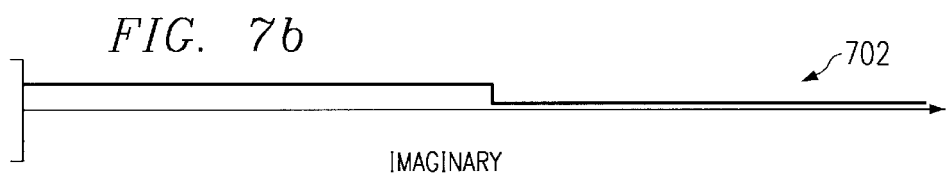
Figure 7C:
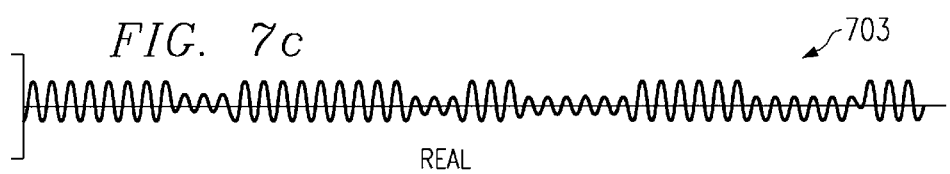
Figure 7D:
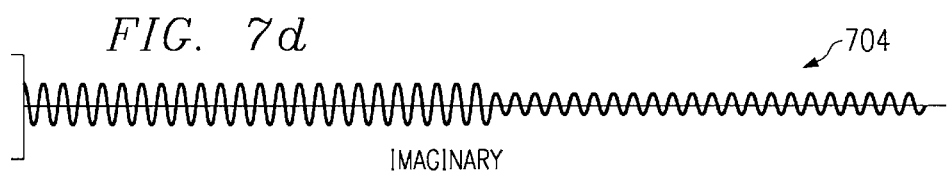
Figure 7E:
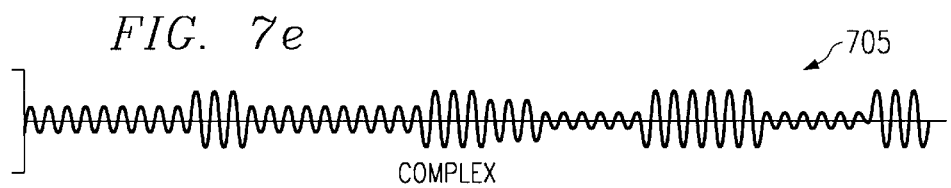

Quadrature-amplitude modulation (QAM) is a popular technique for encoding an information signal onto a carrier waveform. In basic principle, the technique scales two quadrature sinusoidal signals 90° out of phase by two data streams representing the information to be encoded. The corresponding elements from each data stream comprise a symbol. Collectively the valid set of symbols represents the QAM constellation as illustrated in FIG. 6. Each symbol within a QAM constellation is the encoded representation of a number of bits in the information stream.

The QAM signal is comprised of both a real part 601 (Q-axis) and an imaginary part 602 (I-axis). Referring to FIG. 7, one data stream 702, composed of the I-axis coefficients, is multiplied by the sinusoidal carrier signal in the real number domain yielding waveform 704. The second data stream, composed of the Q-axis coefficients 701, is multiplied by a quadrature version of the carrier signal in the imaginary number domain yielding waveform 703. The combination of these two waveforms produces a complex waveform 705. The waveforms of FIG. 7 illustrate this process. Note that each symbol includes an I-Q coefficient pair and has a distinct phase/amplitude profile.

Figure 8:
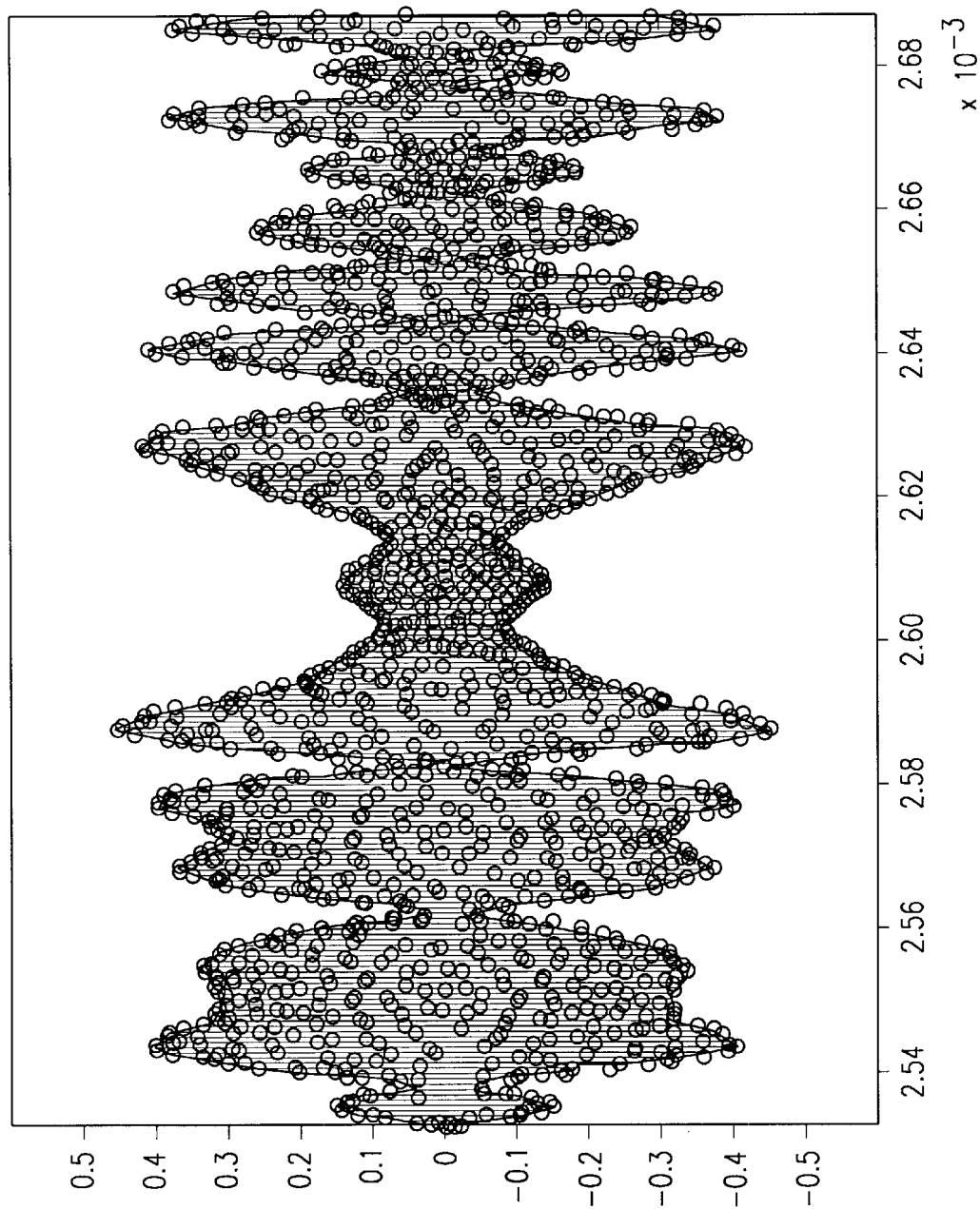
FIG. 8 illustrates the stem plot of a 16QAM signal.

In real systems, the QAM signal is typically conditioned with a pulse-shaping filter such as a root-raised cosine filter. This process produces a waveform without the instantaneous phase shifts evident in the complex waveform of FIG. 7. FIG. 8 illustrates an example of a root-raised cosine filtered QAM signal. Examining the characteristics of the waveform in FIG. 8 reveals some key traits that a prediction algorithm can exploit. First, the signal is essentially a carrier sinusoid with a varying amplitude envelope. The changes in symbol result in the lobes exhibited by the amplitude envelope. In most communications systems there are very stringent rules dictating the carrier frequency. With this knowledge it is a simple matter to generate a carrier waveform at the receiver and scale it by a prediction of the amplitude envelope. Since the carrier frequency is often much higher than the channel symbol rate, a modest over-sampling ratio with respect to the carrier frequency becomes a large over-sampling ratio as compared to the symbol rate. In general, increasing the over-sampling ratio in a prediction system improves the prediction accuracy. Since the real information in the QAM signal is contained in the amplitude and phase changes of the carrier, this increased over-sampling of the information allows a lower sampling frequency while still maintaining good prediction accuracy.

There are many ways to predict future values of the amplitude envelope. The discussion below describes one of the methods developed through the course of the experiment. The first step is to generate the QAM signal amplitude envelope waveform. This process is not as simple as recording the magnitude of each sample because the carrier signal will transition through a number of periods within each symbol related to the ratio of carrier frequency to symbol rate. It is the amplitude of each carrier period that forms the overall amplitude envelope. One method of tracking the carrier amplitude is the moving window peak detector. Essentially this algorithm passes a moving window of N past samples through the waveform. The width of the window is related to the over-sampling ratio of sampling rate to carrier frequency. At every point the envelope estimate is taken as the maximum magnitude of the carrier samples within the window.

Figure 9A:
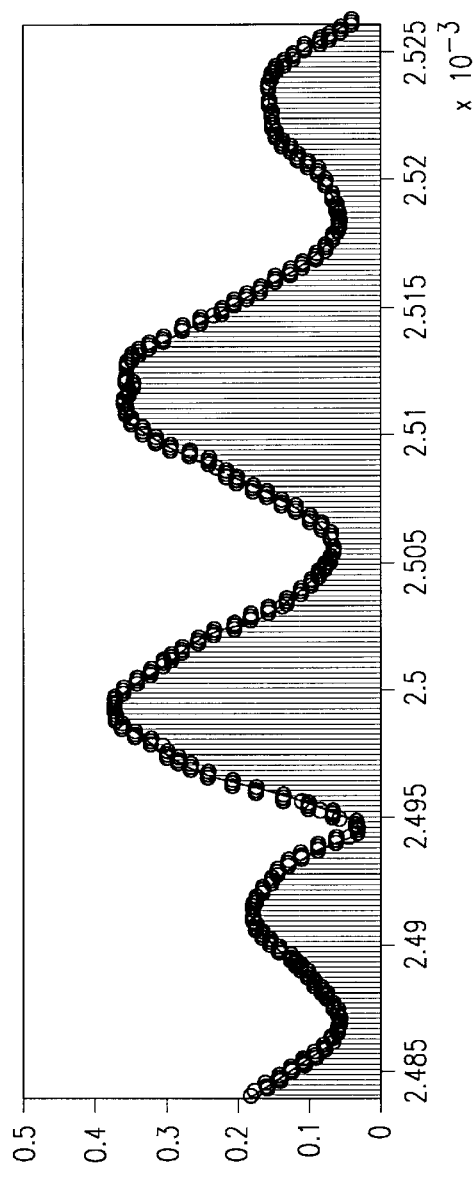
FIGS. 9a–9b illustrates the envelope generated using the peak detector method, with FIG. 9(a) illustrating the detected amplitude envelope of the 16QAM signal and FIG. 9(b) illustrating the original QAM signal.
Figure 9B:
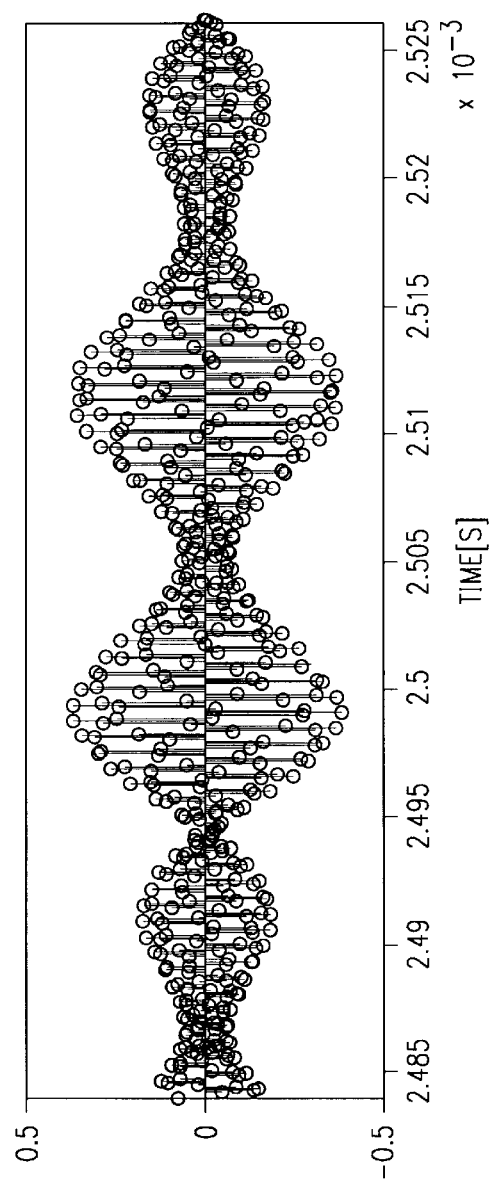
Figure 11A:
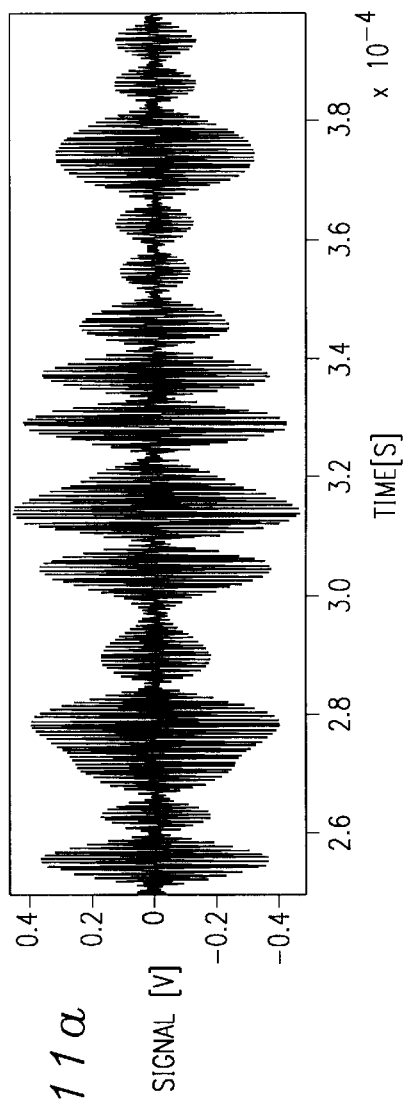
FIGS. 11a–11b illustrates the results of a QAM prediction Scheme with phase tracking enabled, with FIG. 11(a) illustrating the prediction of a 16QAM signal with phase tracking enabled and FIG. 11(b) illustrating the expanded view showing the phase consistency of the predicted waveform.
Figure 11B:
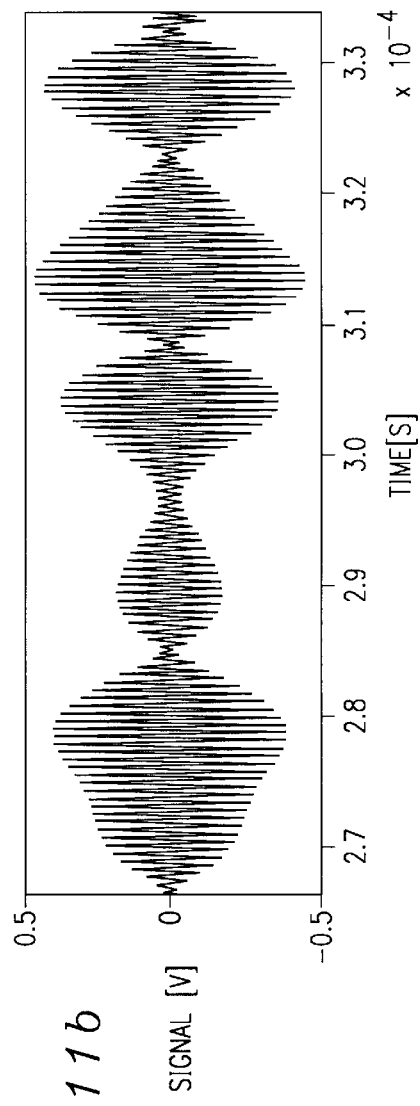

FIG. 9 illustrates the envelope generated using this method. Variations on this method are many. For example, one could split the window into two sub-windows and average the maximum within each. This variant tracks the change in carrier amplitude within a single carrier period.

From the extracted envelope waveform, the prediction step seeks to anticipate the next value of carrier amplitude that will very closely follow the amplitude envelope of the actual signal. This process may be implemented by many techniques. This example uses a prediction algorithm similar to the simple moving-object model. Another option uses an alpha-beta-gamma filter that is an adaptive extension of the simple moving-object model.

Predicting the amplitude envelope only provides one part of the necessary information about a QAM signal. The phase is also an integral part of recreating accurately the received signal. FIG. 10 illustrates the results of a QAM prediction scheme with no phase tracking. In this plot the trace 1001 represents the predicted signals and trace 1002 represents the received signals. Within some symbols the prediction is very accurate with both signals overlaying each other closely. However, the remaining symbols exhibit a predicted signal that is 180 degrees out of phase with the received signal. This discrepancy is the result of the phase information in the QAM signal associated with the symbols.

Detecting the change in carrier phase and correct the model as quickly as possible solves this problem. Observing that the amplitude envelope goes to zero at the symbol boundaries where a phase shift occurs suggests a possible detection criterion. Symbol boundaries where no phase shift takes place appear to remain above some threshold. The problem becomes one of setting an appropriate threshold and detecting when the envelope has crossed below it. It is also effective to monitor the prediction error and switch the carrier phase when it consistently grows worse. This check provides a measure of redundancy for symbol boundaries where the designated threshold is not quite crossed. This occurs due to the nature of sampling.

The effectiveness of the prediction algorithm reflects how close the actual signal corresponds to the prediction. This implies that as the prediction improves, the error signal output of the error amplifier, input to the error decoder becomes smaller. This reduced error signal dynamic range simplifies the error encoder design.

The resolution of the digital-to-analog converter sets the overall resolution of the system. The digital-to-analog converter least significant bit (LSB) is the smallest detectable voltage difference between the prediction and the actual signal.

The prediction accuracy affects the required dynamic range of the error encoder. Conversely, if the error encoder dynamic range is set, it dictates how effective the prediction must be. In a fashion similar to the digital-to-analog converter, the error encoder resolution affects the overall resolution of the predictive converter.

Separate embodiments of the present invention are possible utilizing the following concepts in the digital signal processor. More sophisticated algorithms provide improvements from using a pattern model and calculating coefficients based on specific signal rules. Using adaptive algorithms such as dynamically changing algorithm parameters can improve performance. Using a delta digital-to-analog converter applying the same concepts such as variable least significant bit size and extended dynamic range to the forward path can improve performance. Further improvement is possible by using variable error gain. This increases the dynamic range of the error encoder and aids in the convergence of the prediction algorithm.

Improvements in the architecture for the adaptive predictive data acquisition system can be developed by replacing digital-to-analog converter 308 of FIG. 3 with an N-Bit delta digital-to-analog converter. This reduces information transfer from the digital portion to the analog portion and allows for variable least significant bit (LSB) size processing. In addition, replacing constant gain amplifier 302 with a variable gain error amplifier enables the use of a variable error encoder in block 303 whose dynamic range increases and thereby improves convergence and system adaptability. The variable error gain is a key concept with respect to training or lock-in of the system. Increasing the effective voltage represented by each error encoder least significant, increases the dynamic range of the error encoder. This allows the predictive converter to cope with large errors in the prediction resulting from unanticipated signal behavior or startup transients. As the prediction improves, decreasing the error gain improves the overall converter resolution.

Mathematically, the dynamic range of the system is:

$$\text{Dynamic Range} = 20 \times \log(G_{error} \times 2^k) \quad [13]$$

where: k is the number of bits in the error encoder; and $2^k$ is the number of error encoder least significant bits. The gain error is:

$$G_{error} = \frac{\text{Number of } DAC \text{ } LSBs}{\text{Error Encoder } LSBs} \quad [14]$$

It is useful to view the effect of the 'unexpected' portion of the signal as the prediction error decreases. Consider further the example given earlier of the simple predictive filter derived from a third order difference equation predictor on a one megahertz sinusoid. The plots in FIG. 12A for five times over-sampling ratio show the input signal 1201 versus time differing incrementally from the predicted signal. In FIG. 12B the resulting prediction error 1202 shown at 7.4% of full scale range versus time. The right-hand plots show an expanded view of the prediction error. Where the digital-to-analog converter full-scale range (FSR) specifies the full signal swing possible, the plot reference numbers in FIG. 12 denote the portion of the digital-to-analog converter full scale range that the prediction error represents. As illustrated in FIGS. 12C and 12D, as the over-sampling ratio increases, to ten times in FIGS. 12C and 12D and the prediction accuracy improves, the prediction error falls from 7.4% of the full scale range to 0.68% of the full scale range. These levels dictate the dynamic range required in the error encoder and illustrate the tradeoff between over-sampling ratio and prediction accuracy and error encoder complexity. FIG. 12D also shows clearly that as the level of prediction improves, the signal-to-noise ratio of the error signal decreases. In the plot 1202 of FIG. 12B, with five times over-sampling ratio, the prediction error signal is almost wholly sinusoidal in nature. In the plot 1204 of FIG. 12D, with the over-sampling ratio increased to ten times, the error signal assumes a more noise-dominated character. This relationship is intuitive since increasing the prediction accuracy implies a lower level of signal content in the prediction error.

Figure 13:
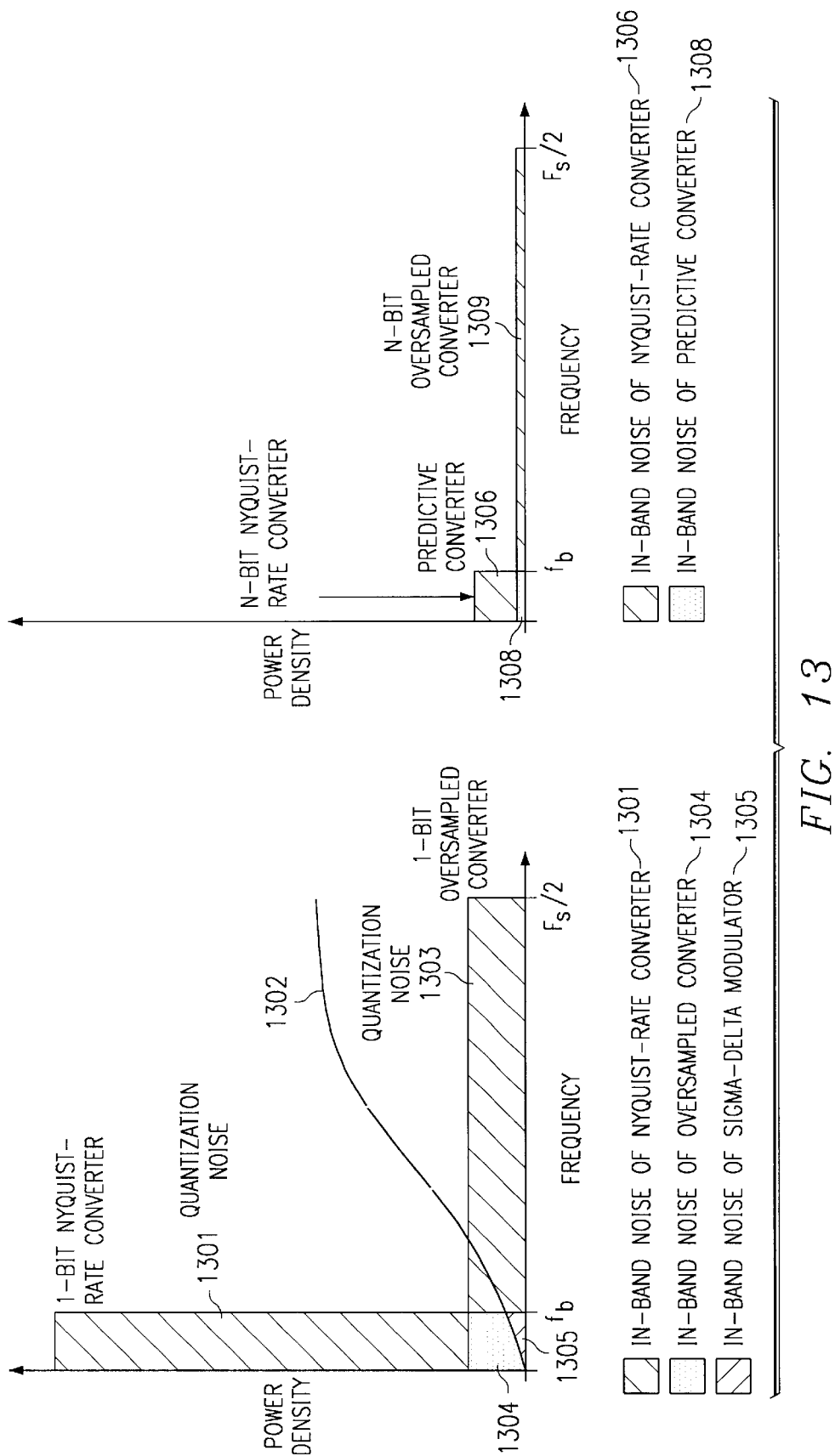
FIG. 13 illustrates a graphical representation of the quantization noise in both a sigma-delta modulator and the predictive converter.

FIGS. 13A and 13B illustrate a comparison of the sampling characteristics between the sigma-delta converter and the predictive converter. A typical sigma-delta converter is based upon low-resolution quantizers, often 1-bit quantization. In FIG. 13A the quantization noise of this low-resolution quantizer operating at the Nyquist sampling rate is shown as region 1301. The Nyquist sampling rate $F_s$ is defined as $2 \times F_b$ where $F_b$ represents the frequency bandwidth of the signal of interest. In this case, the high quantization noise of a low-resolution quantizer is concentrated within the signal bandwidth. Note what happens when over-sampling is applied. The total quantization noise is unchanged, but region 1303 shows the spreading of the quantization noise over a frequency range $F_{s/2}$ which is assumed to be significantly greater than $F_b$. In this case the quantization noise that lies within the bandwidth of interest is region 1304. The action of the sigma-delta converter further changes the quantization noise characteristics by applying a measure of noise-shaping as represented by quantization noise curve 1302. This transfer curve shows that quantization noise is pushed out of the band of interest and into higher frequency bands. The remaining quantization noise region 1305, the portion of region 1304 below the curve 1302, is significantly less than that of the 1-bit Nyquist rate quantizer and demonstrates how even a low-resolution quantizer can achieve high-resolution output.

FIG. 13B gives a similar illustration of the quantization noise in the predictive converter compared to N-Bit rate Nyquist and N-Bit oversampled conventional converters. In the case of the predictive converter, the digital-to-analog converter serving as the quantizer operates at the high-resolution. The Nyquist and oversampled converters require an analog-to-digital converter quantizer of much greater complexity. Thus, for the Nyquist rate quantizer, the quantization noise level shown by region 1306 is significantly lower than in the sigma-delta modulator example. Since the predictive converter is also an over-sampled converter, this total quantization noise becomes spread across a wider frequency bandwidth as shown by region 1309. The resulting quantization noise curve 1308 within the bandwidth of interest $F_b$, is thus improved from the high-resolution level by the process of oversampling.

Figure 14:
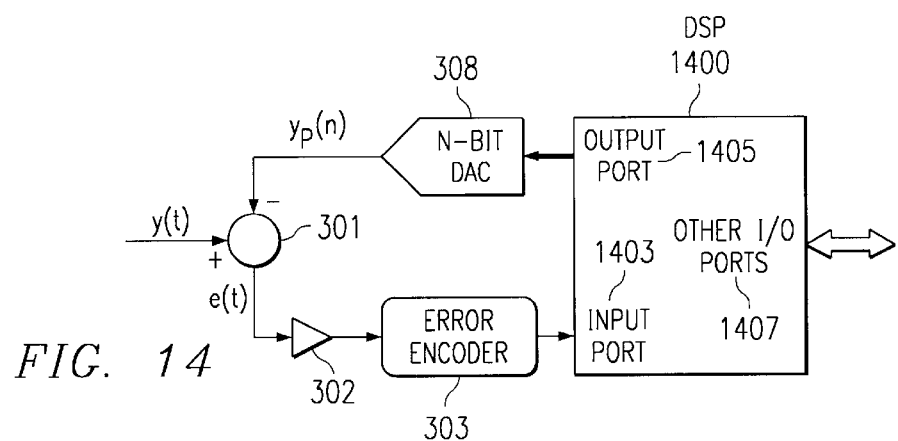
FIG. 14 illustrates a first alternative circuit encoding the predictive process of this invention.
Figure 15:
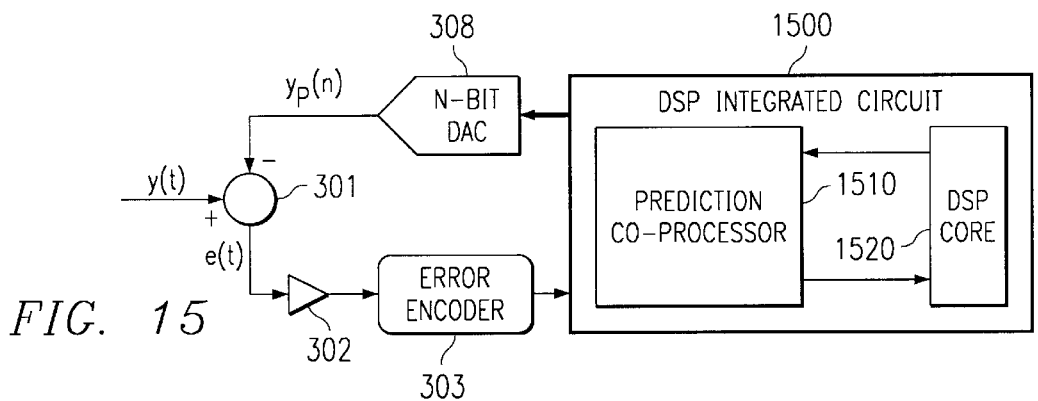
FIG. 15 illustrates a second alternative circuit encoding the predictive process of this invention.
Figure 16:
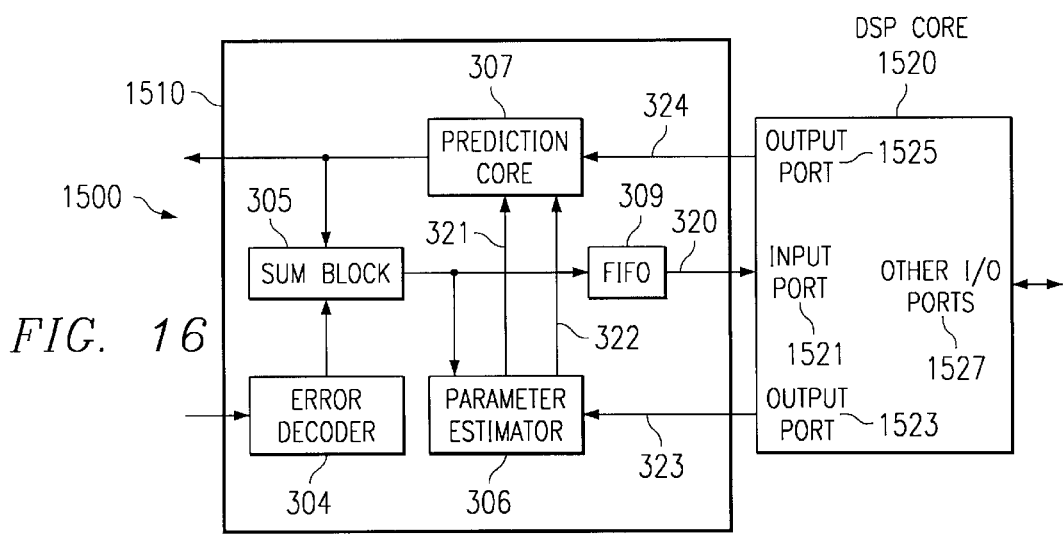
FIG. 16 illustrates the digital portion of one manner of encoding the alternative circuit of FIG. 15.

FIGS. 14, 15 and 16 illustrate alternative circuits embody the predictive process of this invention. FIG. 14 illustrates an analog portion including summing network 301, error amplifier 302, error encoder 303 and digital-to-analog converter 308 as previously illustrated in FIG. 3. In FIG. 14 the digital portion consists of digital signal processor 1400. Digital signal processor 1400 is included in the system because it is needed to perform some processing on the digitized input data. In this embodiment the digital signal processor has enough extra computational capacity to compute the prediction necessary for this invention. Data from error encoder 303 is supplied to input port 1403. Output port 1405 supplies prediction data to digital-to-analog converter 308. Digital signal processor 1400 interacts with other parts of the system via other I/O ports 1407. The functions of error decoder 304, sum block 305, parameter estimator 306, prediction core 307 and first-in-first-out memory 309 are performed by the general digital signal processing resources of digital signal processor 1400. The prediction algorithm is generally a filter and thus may be suitably performed by a programmed digital signal processor. Since this hardware is not specialized for the optimum prediction algorithm for this system, the prediction will naturally be performed slower than with dedicated hardware. The minimum time between predictions is determined by the digital signal processing resources available. This minimum time sets the maximum sampling rate achievable. For some applications, such as low speed precision systems, a low sampling rate may be acceptable. This embodiment has the advantage of requiring minimal hardware. Additionally, it could be made adaptable to the application with appropriate software. Thus a single hardware implementation may be adapted to plural uses by reprogramming. This reprogramming may include reprogramming the prediction algorithm.

FIG. 15 illustrates an alternative embodiment. FIG. 14 illustrates an analog portion including summing network 301, error amplifier 302, error encoder 303 and digital-to-analog converter 308 as previously illustrated in FIG. 3. The digital portion includes digital signal processor 1500. Digital signal processor 1500 differs from digital signal processor 1400 illustrated in FIG. 14 by inclusion of specialized hardware core prediction co-processor 1510. Prediction co-processor 1510 is preferably implemented in the same integrated circuit 1500 as a general purpose digital signal processor core 1520.

Figure 17:
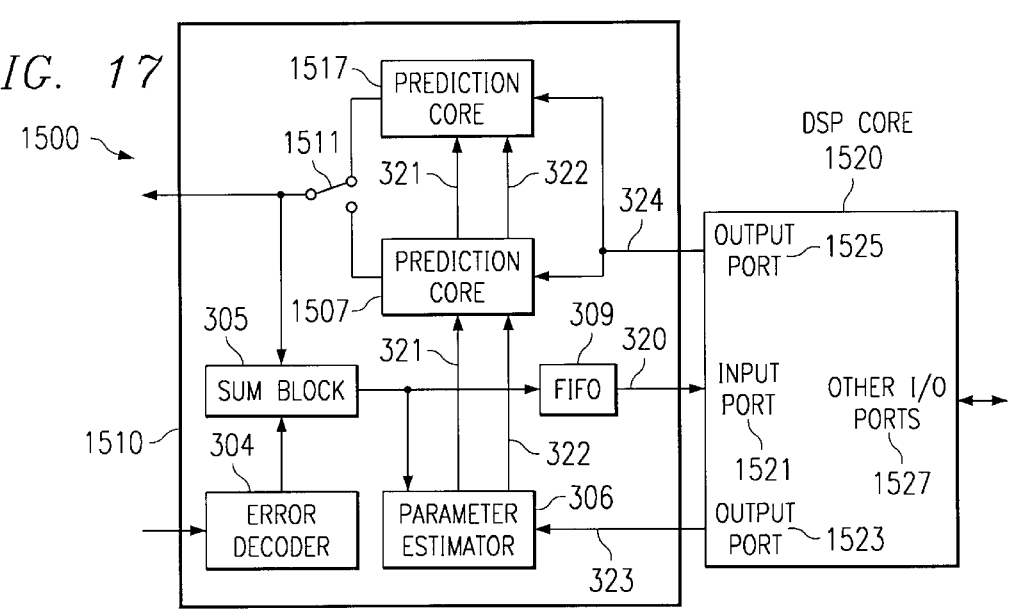
FIG. 17 illustrates the digital portion of a second manner of encoding the alternative circuit of FIG. 15.
Figure 18:
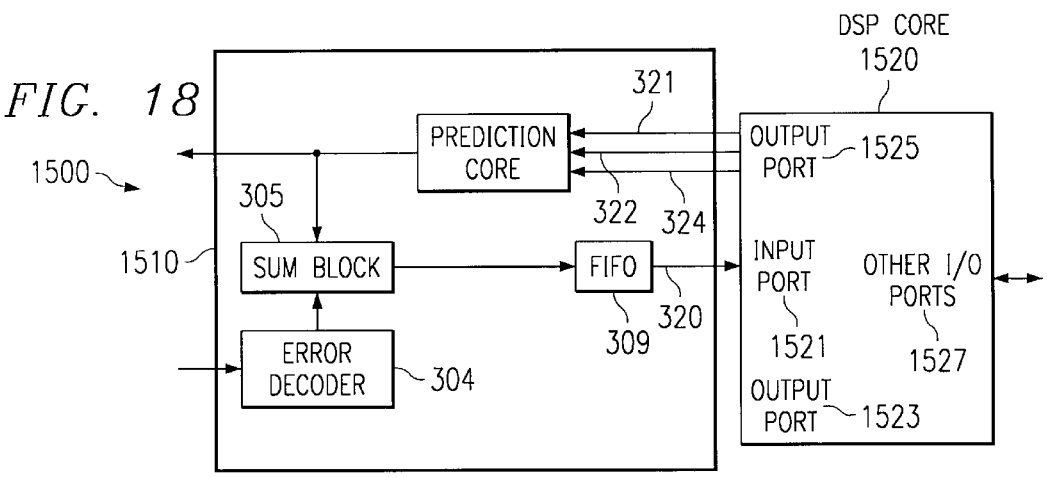
FIG. 18 illustrates the digital portion of a third manner of encoding the alternative circuit of FIG. 15.

There are numerous techniques in which prediction co-processor 1510 can be constructed. FIGS. 16, 17 and 18 illustrate several of these alternatives. FIG. 16 illustrates prediction co-processor 1510 consisting of error decoder 304, sum block 305, parameter estimator 306, prediction core 307 and first-in-first-out memory 309 in the same manner as illustrated in FIG. 3. Thus prediction co-processor 1510 includes hardware for each of these elements. Digital signal processor core 1520 received the digitized sample data 320 (see FIG. 3) via input port 1521. Additionally, digital signal processor core 1520 supplies model parameters 323 to parameter estimator 306 via output port 1523. Digital signal processor core 1520 supplies model parameters 324 to prediction core 307 via output port 1525. For completeness, FIG. 16 illustrates digital signal processor core 1520 includes other I/O ports 1527, which connect to other parts of the system that are not illustrated.

FIG. 17 illustrates an alternative to the structure illustrated in FIG. 16. FIG. 17 illustrates the use of pipelined multiple prediction cores 1507 and 1517. The prediction cores 1507 and 1517 operate alternately as selected by switch 1511. As one of prediction cores 1507 and 1517 supplies predicted signal 317 to digital-to-analog converter 308, the other prediction core is loaded with new parameters from parameter estimator 306. This technique permits an increase in the maximum sampling rate by devoting greater resources to the next sample prediction. It is expected that the computational task for parameter estimation in parameter estimator 306 is not as critical to prediction performance than the prediction core 307.

FIG. 18 illustrates yet another alternative to the structure illustrated in FIG. 16. FIG. 18 illustrates prediction core 307 but not parameter estimator 306. In the embodiment of FIG. 18, digital signal processor core 1520 is programmed to perform the functions of parameter estimator 306 using its general purpose computational resources. Digital signal processing core 1520 supplies signals 321 and 322 to prediction core 307 rather than parameter estimator 306 as shown in FIGS. 16 and 17. Depending on the particular application, provision of prediction core 307 may be all the co-processing assistance needed by digital processing core 1520 to implement the predictive analog-to-digital conversion of this invention.

Each of the embodiments of FIGS. 16, 17 and 18 retain the basic functionality of the predictive analog-to-digital conversion. To implement an adaptable prediction algorithm, the system must generate predicted samples and must change the parameters or coefficients quickly enough that the algorithm tracks the incoming data.

Figure 19:
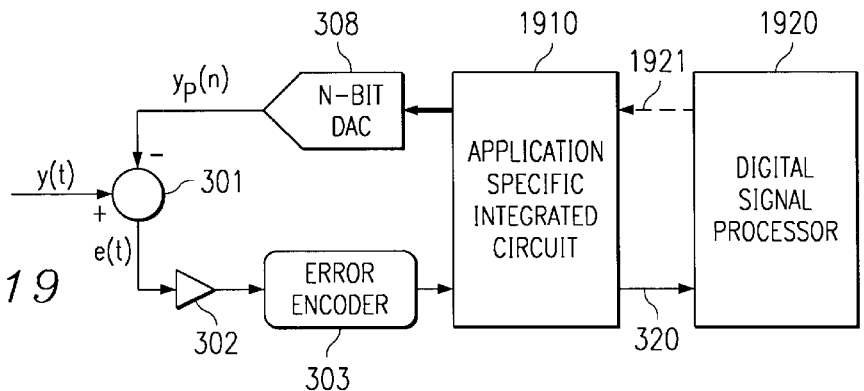
FIG. 19 illustrates a third alternative circuit encoding the predictive process of this invention.

FIG. 19 illustrates still another alternative embodiment. FIG. 18 illustrates an analog portion including summing network 301, error amplifier 302, error encoder 303 and digital-to-analog converter 308 as previously described. Major portions of the prediction algorithm are implemented in application specific integrated circuit 1910. Application specific integrated circuit 1910 includes hardware dedicated to the prediction task illustrated in FIG. 3. Application specific integrated circuit 1910 supplied the resultant sampled data 320 to digital signal processor 1920. In this embodiment application specific integrated circuit 1910 and digital signal processor 1920 are implemented in separate integrated circuits. In some embodiments digital signal processor 1920 may participate in the prediction task as previously described with regard to FIG. 18. In this event digital signal processor 1920 supplies signals 1921 to application specific integrated circuit 1910 communicating the resultant signals 1921 back to application specific integrated circuit 1910. The embodiment of FIG. 19 may be useful in a device using an application specific integrated circuit 1910 together with an analog portion specifically constructed for the type of input expected. This input specific combination could be paired with a general purpose digital signal processor programmed for the particular end product. Thus particular input signals may be digitized in end products with differing uses.

Summarizing, comparisons of predictive conversion to sigma-delta modulation yields some interesting contrasts. Over-sampling spreads quantization noise over an enlarged frequency range. In the predictive converter it is possible to set the analog-to-digital converter and digital-to-analog converter resolution optimizing the quantization noise $N_Q$ by optimizing the number of bits used in the conversion. This quantization noise is a fixed parameter in sigma-delta modulation. Because the output of a predictive converter is an N-bit sequence at the over-sampled data rate, digital decimation improves the signal-to-noise ratio from the N-bit level. Thus the predictive converter produces more useful information than the sigma-delta modulator at the same sampling rate. The predictive converter is software based. The performance of the predictive converter is strongly dependent upon the predictive algorithm. Because it is software based, the predictive converter is inherently configurable and may be efficiently matched to a particular application.

What is claimed is:

1. A method for converting an analog input signal into a sampled digital signal comprising the steps of:

subtracting an analog prediction signal from the analog input signal thereby forming an analog error signal;

encoding the analog error signal into a sampled digital error signal;

generating a sampled digital prediction signal from the current and past sampled digital error signals;

forming the analog prediction signal from the sampled digital prediction signal;

decoding the sample digital error signal; and digitally subtracting the sampled digital error signal from the sampled digital prediction signal thereby forming the sampled digital signal.

2. The method of claim 1, wherein:

said step of encoding the analog error signal into a sampled digital error signal employs an oversampling rate higher than the Nyquist frequency relative to said analog error signal.

3. The method of claim 1, wherein:

said step of encoding the analog error signal into a sampled digital error signal employs a minimum output voltage and a number of data bits in said digital error signal corresponding to an input analog range less than an expected analog range of said analog input signal.

4. The method of claim 1, wherein:

said step of generating a sampled digital prediction signal from the current and past sampled digital signals includes forming a mathematical model of said analog input signal having a plurality of coefficients, periodically calculating a new set of coefficients as a function of previous sampled digital error signals, and periodically calculating said sampled digital prediction signal from said mathematical model and said new set of coefficients.

5. An analog-to-digital conversion apparatus converting an analog input signal into a sampled digital signal comprising:

a analog summer having a first input receiving said analog input signal, a second input and an analog output, said analog output being a difference between a signal received at said first input and a signal received at said second input;

an error encoder having an input connected to said output of said analog summer and a digital output, said digital output corresponding to a signal received at said input;

a digital summer having a first input connected to said output of said error encoder and a second input, said digital summer digitally forming a difference between a signal received at said second input and said output of said error encoder, said output being said sampled digital signal;

a prediction circuit receiving said sampled digital signal from said digital summer and generating a sampled digital prediction signal, said sampled digital prediction signal supplied to said second input of said digital summer;

a digital-to-analog converter having an input receiving said sampled digital prediction signal and generating an analog prediction signal corresponding to said sampled digital prediction signal, said analog prediction signal supplied to said second input of said analog summer.

6. The analog-to-digital conversion apparatus of claim 5, wherein:

said error encoder employs an oversampling rate higher than the Nyquist frequency relative to said analog error signal.

7. The analog-to-digital conversion apparatus of claim 5, wherein:
said error encoder employs a minimum output voltage and a number of data bits in said digital error signal corresponding to an input analog range less than an expected analog range of said analog input signal.

8. The analog-to-digital conversion apparatus of claim 5, wherein:
said digital summer and said prediction circuit are embodied in a general purpose programmable digital signal processor programmed to generate said sampled digital signal and said sampled digital prediction signal.

9. The analog-to-digital conversion apparatus of claim 5, wherein:
said prediction circuit includes
a parameter estimator having a mathematical model of said analog input signal including a plurality of coefficients, said parameter estimator connected to said digital summer receiving said sampled digital signals and periodically calculating a new set of coefficients as a function of previous sampled digital error signals,
a prediction core receiving said set of coefficients from said parameter estimator and calculating said sampled digital prediction signal from said set of coefficients according to said mathematical model.

10. The analog-to-digital conversion apparatus of claim 5, further comprising:
an error decoder receiving said digital output of said error encoder and supplying a decoded sampled digital signal to said first input of said digital summer.

11. The analog-to-digital conversion apparatus of claim 5, further comprising:
a first-in-first-out memory having an input connected to said output of said digital summer and an output supplying said sampled digital signal.

12. The analog-to-digital conversion apparatus of claim 5, wherein:
said prediction circuit includes
a parameter estimator having a mathematical model of said analog input signal including a plurality of coefficients, said parameter estimator connected to said digital summer receiving said sampled digital signals and periodically calculating a new set of coefficients as a function of previous sampled digital error signals,
a first prediction core receiving said set of coefficients from said parameter estimator and calculating a first sampled digital prediction signal from said set of coefficients according to said mathematical model,
a second prediction core receiving said set of coefficients from said parameter estimator and calculating a second sampled digital prediction signal from said set of coefficients according to said mathematical model, and
a switch for alternately connecting either said first sampled digital prediction signal or said second sampled digital prediction signal to said input of said digital-to-analog converter.

13. The analog-to-digital conversion apparatus of claim 5, wherein:
said prediction circuit includes
a general purpose programmable digital signal processor programmed according to a mathematical model of said analog input signal including a plurality of coefficients, said general purpose programmable digital signal processor connected to said digital summer receiving said sampled digital signals and programmed to periodically calculate a new set of coefficients as a function of previous sampled digital error signals, and
a prediction core receiving said set of coefficients from said general purpose programmable digital signal processor and calculating said sampled digital prediction signal from said set of coefficients according to said mathematical model.

14. The analog-to-digital conversion apparatus of claim 5, wherein:
said prediction circuit includes
a parameter estimator having a mathematical model of said analog input signal including a plurality of coefficients, said parameter estimator connected to said digital summer receiving said sampled digital signals and periodically calculating a new set of coefficients as a function of previous sampled digital error signals,
a prediction core receiving said set of coefficients from said parameter estimator and calculating said sampled digital prediction signal from said set of coefficients according to said mathematical model, and
a general purpose programmable digital signal processor having a first output connected to said parameter estimator for supplying first model parameters for initialization of said parameter estimator, a second input connected to said prediction core for supplying second model parameters for initialization of said prediction core and an input connected to said digital summer for receiving said sampled digital signal, said general purpose programmable digital signal processor further programmed for utilization of said sampled digital signal.

15. The analog-to-digital conversion apparatus of claim 14, wherein:
said digital summer, said parameter estimator, said prediction core and said general purpose programmable digital signal processor are disposed on a single integrated circuit.

16. The analog-to-digital conversion apparatus of claim 14, wherein:
said digital summer, said parameter estimator and said prediction core are disposed on a first integrated circuit; and
said general purpose programmable digital signal processor are disposed on a second integrated circuit.

* * * * *